United States Patent
Cousineau et al.

(10) Patent No.: US 6,866,094 B2
(45) Date of Patent: Mar. 15, 2005

(54) TEMPERATURE-CONTROLLED CHUCK WITH RECOVERY OF CIRCULATING TEMPERATURE CONTROL FLUID

(75) Inventors: Shawn M. Cousineau, Hopkinton, MA (US); Robert D. Kelso, Bridgewater, MA (US); Douglas S. Olsen, Natick, MA (US); David Stura, North Billerica, MA (US)

(73) Assignee: Temptronic Corporation, Sharon, MA (US)

( * ) Notice: Subject to any disclaimer, the term of this patent is extended or adjusted under 35 U.S.C. 154(b) by 314 days.

(21) Appl. No.: 09/858,185

(22) Filed: May 15, 2001

(65) Prior Publication Data

US 2002/0003037 A1 Jan. 10, 2002

Related U.S. Application Data

(63) Continuation-in-part of application No. 09/614,488, filed on Jul. 11, 2000, now Pat. No. 6,505,478.

(51) Int. Cl.[7] .......................... H01L 21/00; H01L 21/68; F25B 29/00; B23Q 3/08; F28F 27/02

(52) U.S. Cl. ...................... 165/278; 165/206; 165/48.1; 165/61; 165/263; 165/80.4; 165/63; 165/64; 324/760; 359/395; 430/329; 430/330; 118/724; 118/725; 156/345.52; 156/345.53; 156/345.29

(58) Field of Search .............................. 165/278, 80.1, 165/80.2, 80.4, 80.5, 206, 48.1, 61, 263, 63, 64; 324/760; 359/395; 430/329, 330; 118/724, 725; 156/345.52, 345.53, 345.27

(56) References Cited

U.S. PATENT DOCUMENTS

| 3,066,578 A | 12/1962 | Olton | 165/48.1 |
|---|---|---|---|
| 4,607,220 A | 8/1986 | Hollman | 324/158 |
| 4,682,857 A | 7/1987 | Tan | 350/331 |

(List continued on next page.)

FOREIGN PATENT DOCUMENTS

| EP | 0 255 247 | 7/1987 | |
|---|---|---|---|
| EP | 0 743 530 | 11/1996 | |
| EP | 0 827 187 A2 | 8/1997 | H01L/21/00 |
| JP | 2000183142 | 6/2000 | H01L/21/68 |
| WO | WO 99 34159 | 7/1999 | F25B/29/00 |
| WO | WO 0074117 | 12/2000 | H01L/21/00 |

OTHER PUBLICATIONS

US 5,706,890, 1/1998, Sloan et al. (withdrawn)
3M NOVEC Engineered Fluid HFE–7100 for Heat Transfer, issued Jan. 2002, 3M Corporation.*
techtv. insider "Cool your CPU with hydroFluoroether", Roman Loyola, posted Apr. 9, 2002 at www.techtv.com.*

*Primary Examiner*—John K. Ford
(74) *Attorney, Agent, or Firm*—Mills & Onello, LLP (57) ABSTRACT

A system and method for controlling temperature in a workpiece chuck are described. A fluid circulation system circulates a temperature control fluid, such as an engineered HFE fluid, through te workpiece chuck. A fluid recovery system coupled to the fluid circulation system recovers a portion of the temperature control fluid from the fluid circulation system by circulating a gas through the fluid circulation system including fluid tubes and fluid passages in the chuck. The gas, which can be air, carries a portion of residual or excess fluid through the fluid circulation system as it is circulated. The residual fluid is carried back to a reservoir such that it can continue to be used to control temperature of the chuck. Where gas and temperature control fluid vapors are displaced from the reservoir, they are routed through a suction line heat exchanger which condenses the vapor. The gas and condensed fluid are separated in a fluid separator. The separated fluid is returned to the reservoir, and the separated air can be vented to the atmosphere.

10 Claims, 7 Drawing Sheets

U.S. PATENT DOCUMENTS

| | | | |
|---|---|---|---|
| 4,734,872 A | | 3/1988 | Eager et al. ................ 364/557 |
| 4,802,338 A | | 2/1989 | Oswalt et al. ................ 62/98 |
| 4,893,914 A | | 1/1990 | Hancock et al. ............ 350/530 |
| 5,015,337 A | * | 5/1991 | Fraser ........................ 202/169 |
| 5,034,688 A | | 7/1991 | Moulene et al. ............ 324/158 |
| H1145 H | * | 3/1993 | Anderson .................. 165/80.4 |
| 5,226,471 A | | 7/1993 | Stefani ........................ 165/13 |
| 5,275,237 A | | 1/1994 | Rolfson et al. ............ 165/80.5 |
| 5,435,379 A | | 7/1995 | Moslehi et al. ............ 165/80.4 |
| 5,567,267 A | | 10/1996 | Kazama et al. ............ 156/345 |
| 5,577,552 A | | 11/1996 | Ebinuma et al. ............ 165/296 |
| 5,610,529 A | | 3/1997 | Schwindt .................... 324/760 |
| 5,620,646 A | | 4/1997 | Sparer et al. .......... 264/328.14 |
| 5,651,268 A | | 7/1997 | Aikawa et al. ................ 62/525 |
| 5,779,763 A | * | 7/1998 | Pinnau et al. .................. 95/39 |
| 5,785,741 A | * | 7/1998 | Li et al. .......................... 96/4 |
| 5,846,375 A | | 12/1998 | Gilchrist et al. ............ 156/345 |
| 5,904,807 A | | 5/1999 | Ramm-Schmidt et al. . 159/43.1 |
| 6,026,896 A | | 2/2000 | Hunter ....................... 165/206 |
| 6,032,724 A | | 3/2000 | Hatta ........................ 165/80.2 |
| 6,068,730 A | | 5/2000 | Ramm-Schmidt et al. . 159/43.1 |
| 6,073,681 A | | 6/2000 | Getchel et al. ............ 165/80.1 |
| 6,102,113 A | * | 8/2000 | Cowans ..................... 165/206 |
| 6,148,634 A | * | 11/2000 | Sherwood .................... 62/434 |

\* cited by examiner

TEMPERATURE-CONTROLLED CHUCK WITH RECOVERY OF CIRCULATING TEMPERATURE CONTROL FLUID

RELATED APPLICATIONS

This application is a continuation-in-part of U. S. application Ser. No. 09/614,488, filed on Jul. 11, 2000, now issued U.S. Pat. No. 6,505,478, issued on Jan. 14. 2003, the contents of which are incorporated herein in their entirety by reference.

FIELD OF THE INVENTION

The present invention relates generally to temperature control systems and more specifically to temperature control systems used to control the temperature of a workpiece such as a semiconductor wafer and/or to control the temperature of the workpiece chuck on which the workpiece is held.

BACKGROUND OF THE INVENTION

In the semiconductor integrated circuit industry, the cost of individual integrated circuit chip die is continuing to decrease in comparison to IC package costs. Consequently, it is becoming more important to perform many IC process steps while the die are still in the wafer, rather than after the relatively expensive packaging steps have been performed.

Typically, in IC processing, semiconductor wafers are subjected to a series of test and evaluation steps. For each step, the wafer is held in a stationary position at a process station where the process is performed. For example, circuit probe testing is increasingly performed over a wide temperature range to temperature screen the ICs before assembly into a package. The wafer is typically held stationary relative to a vacuum support surface of a prober machine which electrically tests the circuits on the wafer. The prober includes a group of electrical probes which, in conjunction with a tester, apply predetermined electrical excitations to various predetermined portions of the circuits on the wafer and sense the circuits' responses to the excitations.

In a typical prober system, the wafer is mounted on the top surface of a wafer chuck, which is held at its bottom surface to a support structure of the prober. A vacuum, electrostatic or other type of wafer holding system is typically connected to the chuck. In a vacuum system, a series of channels or void regions in communication with the top surface of the chuck conduct the vacuum to the wafer to hold it in place on the top surface of the chuck. The prober support structure for the chuck is then used to locate the wafer under the probes as required to perform the electrical testing on the wafer circuits.

The chuck can also include a temperature control system which raises and lowers the temperature of the chuck surface and the wafer as required to perform the desired temperature screening of the wafer. It is important to the accuracy of such testing that the temperature of the wafer and, therefore, the temperature of the chuck surface, be controlled as accurately and precisely as possible.

Various approaches to controlling the wafer temperature have been employed. In one prior system, the chuck includes a circulation system through which a cooling fluid is circulated. The cooling fluid is maintained at a constant cold temperature and is circulated through the chuck. Temperature control is realized by activating a heater which is also located in the chuck. The heater is cycled on and off as required to heat the chuck and the workpiece to the required temperature.

In another prior system, both a temperature-controlled fluid and a chuck heater are used to control the workpiece temperature. In this system, the fluid is used to bring the workpiece to within a certain tolerance of the desired set point temperature. The heater is then cycled as required to trim the temperature to the set point.

Temperature control systems can typically include heat exchangers such as condensers and evaporators for heating and cooling a medium such as circulated fluid. In the past, these fluids tended to be harmful to the environment as they evaporated and were vented to the atmosphere. Recently, more environmentally friendly fluids are being used in temperature control systems. These new fluids tend to have reduced damaging effects on the ozone layer and contribute less to global warming. One such class of fluids is hydrofluoroethers (HFE). However, certain drawbacks of HFEs include that they are highly volatile and tend to break down at high temperatures. This causes fluoride ions to be released. This effect is highly undesirable in the semiconductor manufacturing industry and, in particular, on temperature-controlled chucks used in semiconductor processing. Also, in the high-temperature settings found in semiconductor wafer testing, the high volatility of HFEs results in substantial fluid loss as evaporated vapors are vented to the atmosphere.

SUMMARY OF THE INVENTION

In accordance with the invention, there is provided a temperature control system and method for a workpiece chuck in which a temperature control fluid circulated in the chuck is recovered and fluid breakdown within the chuck is substantially reduced. In accordance with the invention, a fluid circulation system circulates the temperature control fluid through the workpiece chuck. A fluid recovery system is coupled to the fluid circulation system for recovering a portion of the temperature control fluid from the fluid circulation system. The fluid recovery system comprises a gas inlet for allowing gas to be forced into the fluid circulation system and circulated through the fluid circulation system to carry the portion of the temperature control fluid through the fluid circulation system. The combination of gas and fluid are routed to a reservoir via an outlet of the fluid circulation system.

In one embodiment, the fluid recovery system provides the capability of recovering fluid that may be displaced from the reservoir in the form of vapor in the area above the fluid in the reservoir. When the reservoir receives the circulated air and recovered fluid, the air and fluid vapors in the reservoir may be displaced out of the reservoir. Were these vapors to be simply vented to the atmosphere, substantial fluid loss would result. In accordance with the invention, the fluid in the vapor is recovered. To that end, the fluid recovery system can also include a heat exchanger which receives displaced gas and vapor from the reservoir. The heat exchanger condenses the vapor back into liquid. In one embodiment, the resulting combination of gas and condensed liquid are routed to a fluid separator which separates them. The condensed fluid is then routed back to the reservoir where it can continue to be used to control temperature in the chuck. The separated gas can be vented to the atmosphere.

In one embodiment, the temperature control fluid is or includes a hydrofluoroether (HFE). In one particular embodiment, the fluid is or includes methoxynonafluorobutane (C4F9OCH3). In one embodiment, the gas circulated through the fluid circulation system is air.

The system and method of the invention provides numerous advantages over prior approaches to temperature control using circulated fluids. Because the residual fluid can be purged from the chuck of the invention, the drawbacks associated with fluorine ions breaking out of the fluid at high temperatures are substantially eliminated. Also, by condensing the fluid vapor and returning it to the temperature control system, substantial fluid loss is eliminated. These advantages provided by the invention make the environmentally friendly hydrofluoroether class of fluids applicable to high-temperature semiconductor wafer fabrication and testing.

BRIEF DESCRIPTION OF THE DRAWINGS

The foregoing and other objects, features, and advantages of the invention will be apparent from the following more particular description of preferred embodiments of the invention, as illustrated in the accompanying drawing. The drawing is not necessarily to scale, emphasis instead being placed upon illustrating the principles of the invention.

DETAILED DESCRIPTION OF PREFERRED EMBODIMENTS OF THE INVENTION

Figure 1:
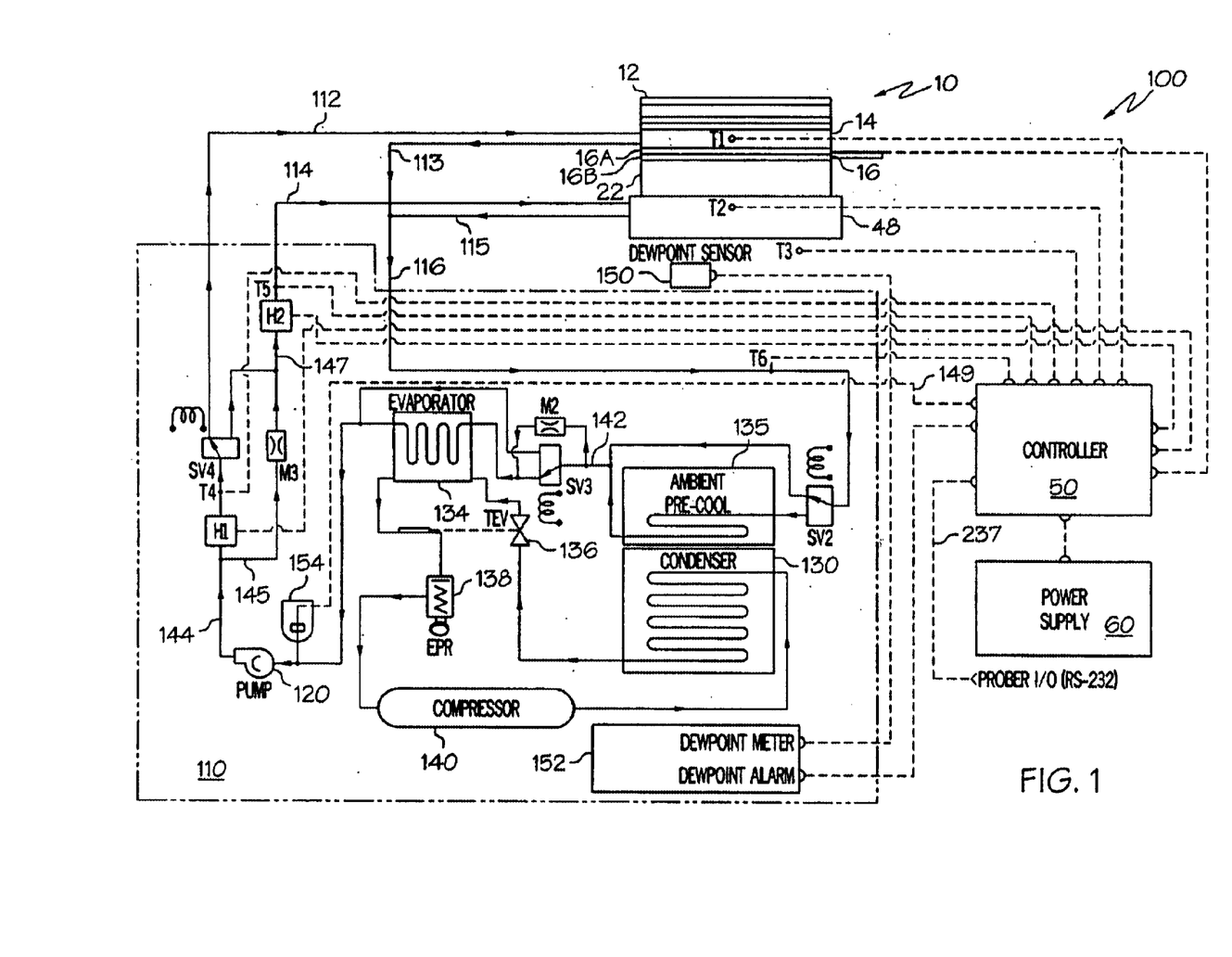
FIG. 1 is a schematic detailed block diagram of one embodiment of the temperature control system of the invention.

FIG. 1 is a schematic diagram of one particular temperature control system 100 in which the heat exchanger and temperature control approach in accordance with the present invention can be used. The temperature control system in the example of FIG. 1 is used in connection with a workpiece chuck 10. The chuck 10 can be used to hold on its top surface 12 a flat workpiece such as a semiconductor wafer during processing and can be of the type described in, for example, U.S. Pat. No. 6,073,681, issued on Jun. 13, 2000, entitled, "Workpiece Chuck;" U. S. Pat. No. 6,019,164, issued on Feb. 1, 2000, entitled, "Workpiece Chuck;" and copending U. S. patent application Ser. No. 09/473,099, filed on Dec. 28, 1999, entitled, "Workpiece Chuck;" now issued U.S. Pat. No. 6,328,096, issued on Dec. 11, 2001, all of which are assigned to the same assignee as the present application, and all of which are incorporated herein in their entirety by reference.

The processing performed on the workpiece can include electrical circuit testing on a wafer over a predetermined range of temperatures using a host machine such as a prober machine. To implement temperature cycling of the wafer, the chuck 10 includes a heat sink 14 through which fluid can be circulated and an electrical heater 16 which can be used to heat the wafer. The temperature control system 100 of the invention is used to control the heater 16 and the temperature and flow of fluid through the heat sink 14 in order to control the temperature of the chuck and, therefore, the temperature of the wafer under test. As described in detail below, in one embodiment, the heater 16, also referred to herein as H3, can actually include two resistive heating elements 16A and 16B, each of which is powered by its own individually controllable power signal provided by the power and control system of the invention. The heating elements 16A and 16B are individually controllable to permit implementation of a multiple-stage, e.g., two-stage, workpiece heating procedure as described below in detail.

It should be noted that in FIG. 1 broken or dashed lines indicate electrical connections and solid lines with arrowheads indicate lines for implementing flow of a thermodynamic medium such as the fluid used for controlling the temperature of the chuck or the refrigerant used to cool that fluid.

The system 100 of the invention can also be used to maintain a lower portion of the chuck 10 at ambient environment temperature to prevent heat flow between the chuck 10 and the host machine. To that end, the chuck 10 includes a lower support or plate 22, which can be a ceramic thermal and electrical insulating plate, which is mounted to a base 48. In one embodiment, the base 48 is part of the host machine on which the chuck 10 is mounted. In another embodiment, as shown in FIG. 1, the base 48 is part of the chuck. The base will be referred to herein as being part of the chuck 10, but it will be understood that it can also be a part of the host machine. In either case, the temperature of the base 48 is controlled to control heat flow between the chuck 10 and the host machine. The fluid can be circulated through the base 48 to maintain the base at ambient temperature. This sets up a heat flow barrier between the chuck and the host machine.

The temperature control system 100 of the invention includes a fluid temperature control module 110 which controls the temperature and the flow of fluid to and from the chuck 10. The fluid is carried into the heat sink 14 via an inlet line 112 and out of the heat sink 14 via a return line 113. The fluid can also be carried into the base 48 via another inlet line 114 and out of the base 48 via another return line 115. The two return lines 113 and 115 join together into a single return line 116 which returns the fluid to the fluid control module 110. The fluid can be methyl nonafluoroisobutyl ether. Alternatively, the fluid can be methyl nonafluorobutyl ether. The fluid can also be methoxy-nonafluorobutane ($C_4F_9OCH_3$), also known as 3M™ Novec™ Engineered Fluid HFE-7100.

The system 100 of the invention also includes a power and control system which can include an electrical controller 50 and a power supply 60. The controller 50 receives electrical input signals from various components of the system 100 and transmits electrical control signals to system components as required to perform the required temperature control functions of the system 110. The power supply 60 supplies power to the various system components and the controller 50 as required.

In one embodiment of the invention, temperature feedback is provided to the controller 50 by a series of temperature sensors located at various positions in the chuck 10 and the temperature control module 110. In the embodiment shown in FIG. 1, six temperature sensors, labeled T1–T6, are used. It should be noted that the references to T1–T6 contained herein can be to either the sensor itself or the temperature value it indicates. It will be clear from the context which is intended.

Sensor T1 is the chuck upper surface temperature sensor which indicates the chuck temperature at or near the heat sink 14. In one embodiment, before temperature testing, a calibration process is performed in which the difference between the temperature at sensor T1 and the actual temperature at the wafer is determined. During the calibration, temperature of the wafer at the top surface can be determined by a surface-mounted thermocouple or other temperature sensor, or by using a calibrated diode on the wafer, or by some other technique; and a correction factor is generated which identifies the temperature differential between sensor T1 and the wafer surface. That correction factor is used as an adjustment during subsequent temperature control processes to maintain the wafer at the desired temperature. Alternatively, a contact or non-contact temperature sensor can be used at the wafer surface to provide the T1 temperature measurement. This eliminates the need for the calibration. This temperature sensor can be a calibrated diode, a thermocouple or any other contact or non-contact sensor.

Sensor T2 is the base temperature sensor. It senses the temperature at the base 48. This temperature is maintained at or near ambient temperature (sensor T3) to prevent heat flow between the chuck 10 and the host machine. Sensor T3 is the ambient air/environment temperature sensor. It senses the ambient temperature of the environment around the chuck and the host machine. Ideally, by circulating fluid through the base 48, T2 is maintained as close as possible to T3 to prevent heat flow between the chuck and the host machine.

Sensor T4 is a fluid temperature sensor. It senses the temperature of the fluid as it flows out of the fluid heater H1 and before it flows to either the heat sink 14 via line 112 or the base 48 via fluid heater H2 and line 114, depending upon the state of valve SV4. The temperature at T4 is monitored to allow control of the fluid temperature as it enters the heat sink 14 or the base 48.

Sensor T5 is the base fluid temperature sensor. It senses the temperature of the fluid as it flows out of the fluid temperature control module 110 toward the chuck 10 along line 114. The temperature at T5 is monitored to allow control of the fluid temperature as it enters the base 48, such that the base temperature (T2) can be maintained near ambient temperature (T3).

Sensor T6 is the return fluid temperature sensor. It senses the temperature of the fluid as it returns from the chuck 10 along return line 116. It is used to determine whether thermodynamic processes such as pre-cool should be performed on the fluid before it is circulated back to the chuck 10.

It should be noted that other temperature sensor configurations can be used. For example, sensors T1 and T2 can be located in return tubes 113 and 115, or additional sensors can be added to either or both of tubes 113 and 115.

The temperature control system 100 also includes the pair of fluid heaters H1 and H2 for heating the circulating fluid as required. Heater H2, the base fluid temperature control heater, heats fluid that is directed through the base 48. Heater H1, the chuck/base fluid temperature control heater, heats fluid that can be circulated through either the heat sink 14 or the base 48, depending on the state of SV4. As mentioned above, the system 100 also includes the chuck temperature control heater 16 (H3), which is located in the chuck 10 to provide heat directly to the chuck 10 to heat the workpiece and which can actually include multiple individually controllable heating elements 16A and 16B.

The flow of fluid through the system 100 is controlled via the controller 50 by a pump 120 and a series of valves. The pump 120 receives the fluid from the evaporator 134 and/or its bypass and accumulator 154 and pumps the fluid toward the fluid heaters H1 and H2 and then to the heat sink 14 and/or base 48.

The condenser 130, evaporator 134, thermal expansion valve 136, compressor 140 and pressure regulator 138 are used to implement a capacity-controlled refrigeration cycle that cools the fluid as required. Under particular predetermined circumstances described below, solenoid valves SV2 and SV3 are used to route the fluid through the refrigeration system as required to remove heat from the fluid. Under other circumstances, SV2 and SV3 are used to route the fluid such that it bypasses one or more portions of the refrigeration cycle. The ambient pre-cooler select solenoid valve SV2 is used to route the fluid through the ambient pre-cool heat exchanger 135. When ambient pre-cool is desired, SV2 is switched to its ON state to route the fluid through the pre-cool heat exchanger 135. When SV2 is OFF, as shown in FIG. 1, the fluid bypasses ambient pre-cool.

When further cooling of the fluid is desired, the fluid can be routed through the evaporator 134. The evaporator bypass select solenoid valve SV3 and the evaporator bypass coolant fluid metering valve M2 are used to control the flow of fluid through the evaporator 134. The metering valve M2 always allows a predetermined percentage of the fluid in line 142 to bypass the solenoid valve SV3 and flow into the evaporator 134 for cooling. In one embodiment, this percentage is set to about 15%. When SV3 is in its OFF state as shown in FIG. 1, all of the fluid in line 142 is routed through the evaporator for cooling. When SV3 is ON, the predetermined percentage (15%) of fluid flows into the evaporator 134, and the remaining fluid bypasses the evaporator 134 and flows toward pump 120.

A predetermined amount of the fluid at the outlet of pump 120 flowing in line 144 flows into heater H1. This amount is set by the base supply fluid metering valve M3. In one embodiment, M3 is set to cause 5% of the fluid in line 144 to bypass H1 and flow toward H2 in line 145 and the remaining 95% to flow through H1. Thus, in this configuration, some portion of the fluid will always flow through the base 48, and the temperature of that portion is controllable.

Under certain conditions, such as when the chuck is being heated by the chuck heater(s) 16 (H3), the fluid out of heater H1 will be routed by the chuck heat sink bypass select solenoid valve SV4 to line 147 to flow through heater H2 and the base 48 instead of the heat sink 14. When SV4 is ON, all of the fluid out of both H1 and H2 flows through the base 48. When SV4 is OFF as shown, the fluid out of the heater H1 is routed through the heat sink 14.

The system 100 also incorporates a dewpoint sensor 150 and a dewpoint meter 152. The dewpoint sensor 150 detects the dewpoint in the ambient environment around the chuck 10 and generates and transmits an electrical signal indicative of the sensed dewpoint to the dewpoint meter 152. The dewpoint meter 152 can send a dewpoint alarm signal to the controller 50 by closing a switch if the dewpoint rises above a particular value. Corrective actions such as heating the chuck to ambient and shutting down the system can be taken to avoid damage to the workpiece due to environmental factors such as frost formation.

The accumulator 154 serves as a reservoir for the fluid circulated through the chuck 10. The accumulator holds enough fluid to accommodate expansion and contraction of the fluid over the wide operating temperature range of the system. A signal indicating a low fluid level is generated by the accumulator 154 and transmitted to the controller 50 on line 149.

The controller 50 can also receive inputs from the host machine, e.g., prober, via an RS-232 interface 237. The RS-232 interface allows the host machine to communicate to the chuck such information as new chuck temperature set points.

The control logic used by the temperature control system 100 will now be described in detail. Certain variables are defined in connection with the operation of the system 100. $T_C$ is defined as the temperature set point for the chuck 10. It is the temperature to which it is presently desired to set the chuck. $T_{EB}$ is the evaporator bypass switching temperature. It is a constant positive number to which $T_C$ is compared under some conditions. $T_S$ is the support plate or base temperature set point and is typically approximately equal to T3, the ambient air/environment temperature. $DT_C$ is the chuck temperature deviation which is a measure of the difference between the chuck temperature T1 and the chuck temperature set point $T_C$, i.e., $DT_C=T1-T_C$.

$DT_S$ is the maximum value of chuck temperature deviation for which the chuck is defined to be at steady state and is typically equal to a constant positive number between 1 and 5° C. The chuck temperature is considered to be at steady state when the magnitude of the difference between the actual temperature and the set point ($DT_C$) is small, that is, when the actual temperature is only slightly different from the desired temperature. Specifically, the chuck is considered to be at steady state when $-DT_S<DT_C<DT_S$.

The system 100 controls temperature of the chuck and workpiece over a wide range of temperatures. In one embodiment, the temperature range is effectively divided into a lower subrange and an upper subrange. In the lower subrange, the temperature of the chuck 10 and workpiece are controlled by fluid flow through the chuck 10 only; the chuck heater 16 (H3) is not activated. This is true even when the temperature set point may be above ambient temperature. In that case, the fluid provides the required heating. In the upper subrange, the chuck heater 16 is used to heat the chuck 10 and workpiece. The temperature at the boundary between the lower subrange and the upper subrange will be referred to herein by $T_B$. In one embodiment, $T_B=+40°$ C. Hence, where the total temperature range is, for example, −10° C. to +200° C., the lower subrange can extend from −10° C. to +39.9° C., and the upper subrange can extend from +40° C. to +200° C. Other temperature subranges can also be selected.

To describe the logical operation of the system 100, the settings of the various components of the system 100 will be described along with the physical system conditions under which the settings are made. As mentioned above, the compressor 140 and condenser 130 are part of a refrigeration system which is controllable to control the temperature of the fluid circulated through the chuck 10 in accordance with the present invention. The compressor 140 and condenser fan are ON when the system 100 is in operation and OFF otherwise. The pump 120 used to circulate the fluid through the chuck 10 is also ON when the system 100 is in operation and OFF otherwise.

Valve SV2 will be turned ON to implement the ambient pre-cool by routing the fluid through the pre-cool heat exchanger 135 when it is desired to cool the chuck to a set point temperature that is far enough below the current actual chuck temperature $T_1$ to take the system out of steady state, i.e., $DT_C>DT_S$, and the temperature $T_1$ is greater than $T_B$. Otherwise, SV2 will be turned OFF to bypass the ambient pre-cool.

As described above, when solenoid valve SV3 is OFF as shown in FIG. 1, the fluid is routed through the evaporator 134 to cool the fluid. When SV3 is ON, most of the fluid is routed to heater H1 to heat the fluid. SV3 will be turned ON under either of two sets of conditions. It will be ON when it is desired to heat the chuck to a temperature that is high enough above the current actual chuck temperature to take the system out of steady state, i.e., $DT_C<-DT_S$. Alternatively, SV3 will be ON when the system is in the steady state condition, i.e., $-DT_S<DT_C<DT_S$, and it is desired to operate the system in the upper temperature subrange, i.e., $T_C>T_B$. Otherwise, SV3 will be turned OFF to cool the fluid.

As described above, solenoid valve SV4 controls whether the fluid out of heater H1 is routed to the heat sink 14 or the base 48. When SV4 is ON, the fluid is routed to the base 48; when SV4 is OFF, the fluid is routed to the heat sink 14. SV4 will be turned ON when it is desired to operate the system in the upper temperature subrange, i.e., when $T_C>T_B$, except when it is desired to cool the chuck to a set point temperature that is far enough below the current actual chuck temperature to take the system out of steady state, i.e., when $DT_C>DT_S$. Otherwise, SV4 will be ON.

The heaters H1, H2 and H3 can be controlled by proportional-integral-derivative (PID) control loops implemented in the controller 50. The various temperature sensors T1–T6 provide the required temperature feedback which allows the controller 50 to control the heaters. The controller 50 provides pulse-width modulated signals to cycle the heaters on and off as required.

Heater H1 is cycled ON via the PID control to maintain the chuck temperature T1 equal to the set point temperature $T_C$ when it is desired to operate the system in the lower temperature subrange, i.e., when $T_C<T_B$, except when it is desired to cool the chuck to a temperature that is far enough below the current actual chuck temperature to take the system out of steady state, i.e., when $DT_C>DT_S$. Heater H1 is also cycled ON to maintain the support plate temperature T2 equal to the ambient air/environment temperature T3 when it is desired to operate the system in the upper temperature subrange, i.e., when $T_C \geq T_B$, except when it is desired to cool the chuck to a temperature that is far enough below the current actual chuck temperature to take the system out of steady state, i.e., when $DT_C>DT_S$. Heater H1 is OFF under other conditions.

Heater H2 is cycled ON via the PID control to maintain the base temperature T2 equal to the ambient air/environment temperature T3 except when SV4 is turned ON to cause the fluid out of heater H1 to flow through the base 48. In this case, heater H1 handles the bulk of the heating load for the fluid. Under other circumstances, heater H2 is OFF.

The chuck heater H3 is cycled on via PID control to maintain the temperature of the chuck T1 equal to the set point temperature $T_C$ when it is desired to operate the system in the upper temperature subrange, i.e., when $T_C>T_B$, except when it is desired to cool the chuck to a temperature that is far enough below the current actual chuck temperature to take the system out of steady state, i.e., when $DT_C>DT_S$. Under other conditions, the heater H3 is OFF.

Figure 2:
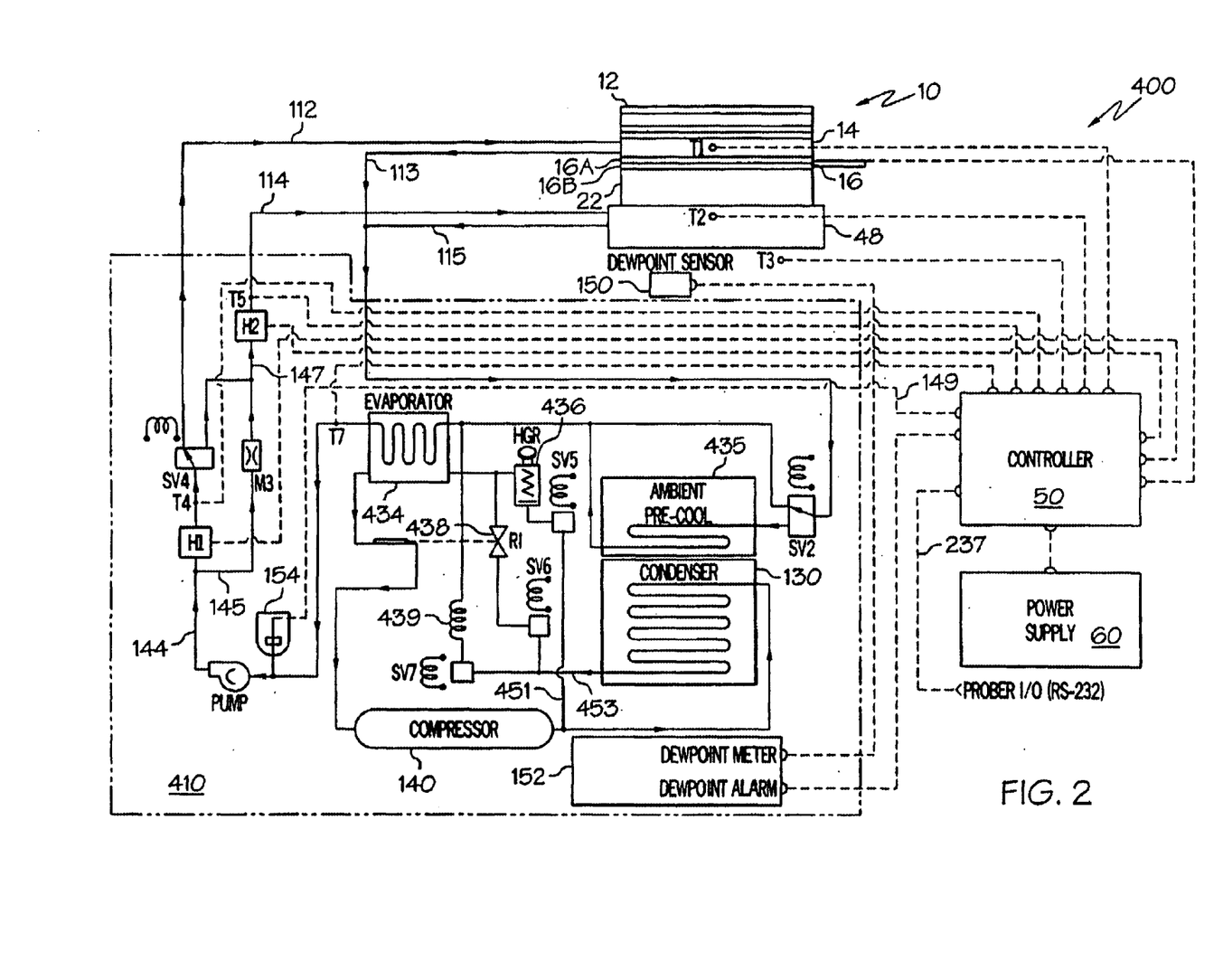
FIG. 2 is a schematic detailed block diagram of an alternative embodiment of the temperature control system of the invention.

FIG. 2 is a schematic detailed block diagram of another temperature control system 400 in which the present invention can be used. The components and control logic described above in connection with FIG. 1 are the same as those of FIG. 2 with some exceptions as described below. The system 400 of FIG. 2 uses a different fluid temperature control system 410 than the system 100 described in connection with FIG. 1. The fluid refrigeration system of FIG. 2 includes a condenser 130 and an evaporator 434. The refrigerant used to cool the circulation fluid exits the condenser 130 along line 453 and enters an expansion valve 438 where it is throttled before it enters the evaporator 434. The solenoid valve SV2 can be used to bypass the ambient pre-cool heat exchanger 435 when further cooling of the chuck temperature control fluid is not desired. However, the solenoid valve SV3 of the system of FIG. 1, used to bypass the evaporator where further cooling is not required, is not included in the fluid temperature control system 410 of FIG. 2. Instead, when further cooling of the fluid is not desired, the normally closed solenoid valve SV6 is held closed to shut off cold refrigerant to the evaporator, and hot gas from the compressor is fed along line 451 into the evaporator 434 to provide heating of the fluid. In one configuration, when this extra heating is desired, the optional hot gas bypass enable solenoid valve SV5 is opened to allow the hot gas from the compressor 140 to be transmitted to the evaporator 434. A hot gas pressure regulator 436 is used to control the amount of hot gas introduced to the evaporator 434 according to the amount of heating required.

Hence, SV6 is used in controlling the fluid temperature by modulating refrigeration capacity at the evaporator heat exchanger 434. SV6 may be controlled through a controller PID loop to maintain fluid temperature as precisely as required.

In one configuration, another optional valve SV7 is included between the condenser 130 and evaporator 434. Valve SV7 feeds a fast response metering device which can be a capillary tube 439. SV7 can also be controlled through a PID loop. It differs from SV6 however in that it controls a lower capacity, faster responding metering device (capillary tube 439). Where this arrangement is used, SV6 can be energized for maximum capacity, during transitions for example. SV7 can then be used to maintain the set point precisely after transition while SV6 is de-energized.

Also, temperature sensor T6 in FIG. 1 is not used in the system of FIG. 2, and another temperature sensor T7 is added. Sensor T7 is the evaporator fluid outlet temperature sensor. It senses the temperature of the fluid as it leaves the evaporator heat exchange 434. The sensed temperature at T7 is used to adjust the refrigeration capacity of the fluid refrigeration subsystem which includes condenser 130, compressor 140 and evaporator 434.

The power and control system used to control and operate the temperature control systems of FIGS. 1 and 2 can be of the type described in U.S. Pat. No. 6,091,060, issued on Jul. 18, 2000, entitled, "Power and Control System for a Workpiece Chuck," of the same assignee as the assignee of the present application. That patent is incorporated herein in its entirety by reference.

In accordance with the present invention, the evaporators 134 and 434 in the temperature control systems of FIGS. 1 and 2, respectively, are extremely efficient. In the evaporator of the invention, the refrigerant flowing through the evaporator is distributed evenly over the internal plates such that even cooling of the plates is achieved.

Figure 3:
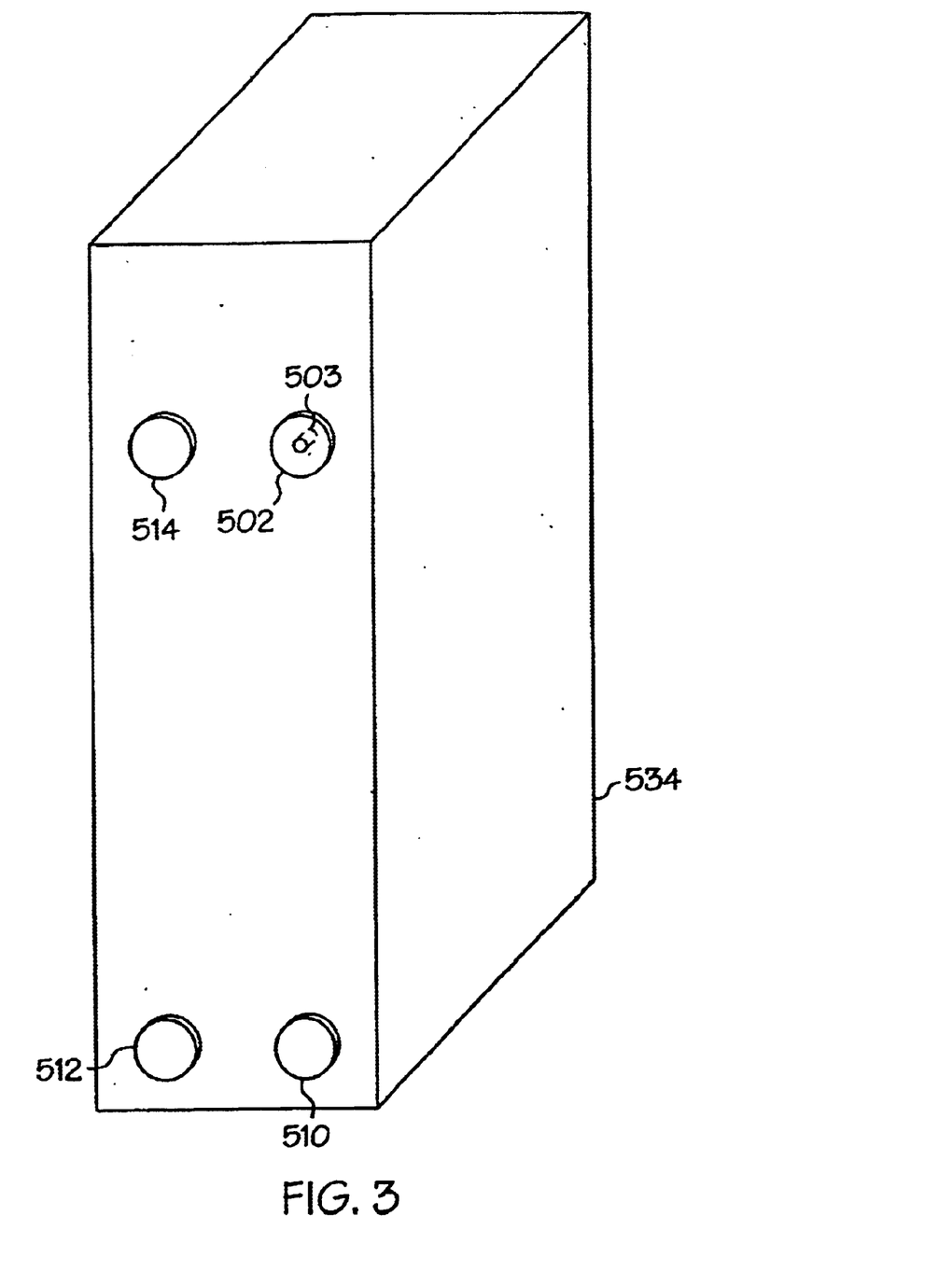
FIG. 3 contains a schematic perspective view of an evaporator in accordance with one embodiment of the present invention.
Figure 4:
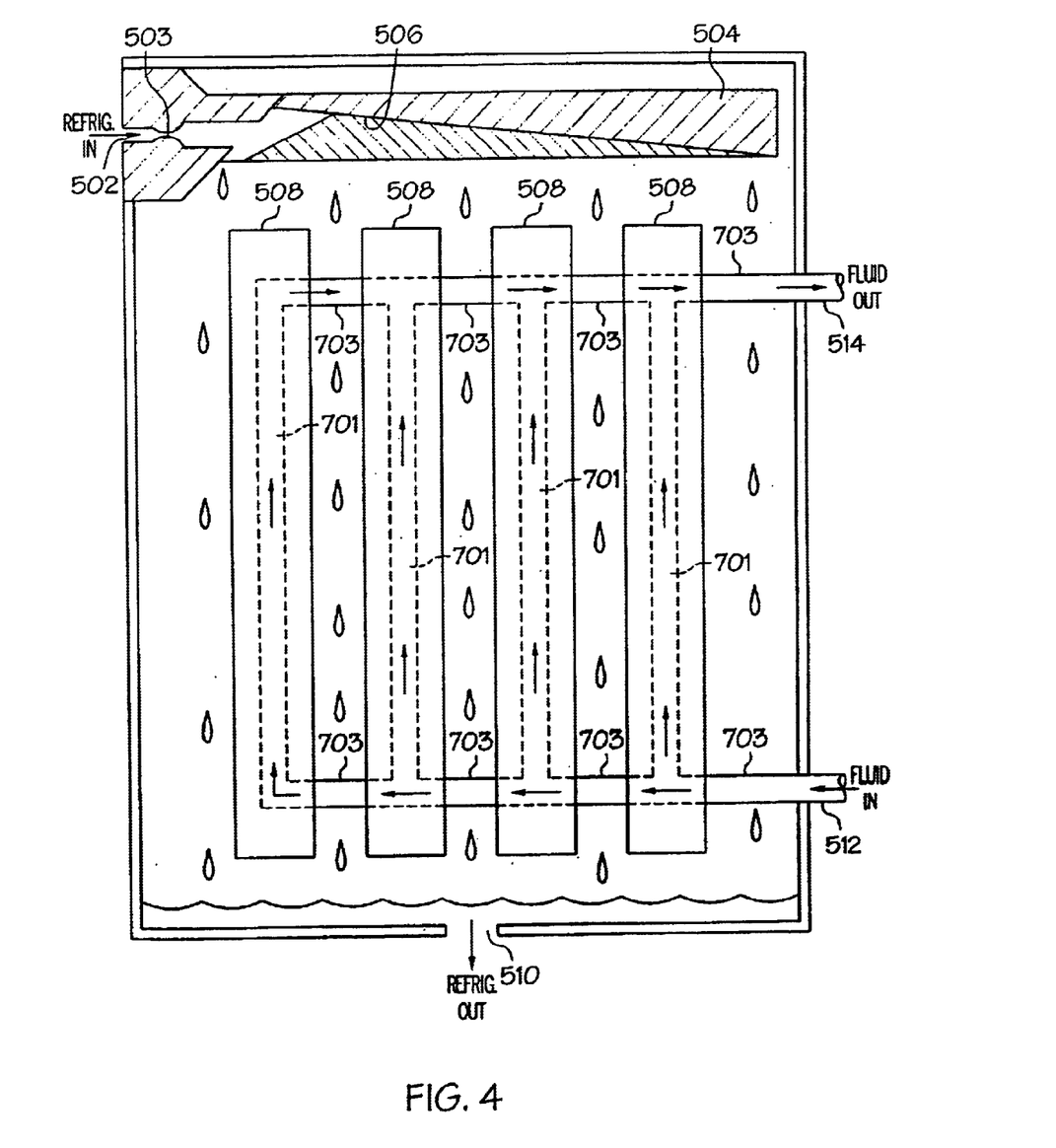
FIG. 4 is a schematic cross-sectional diagram of the interior of the evaporator of FIG. 3 in accordance with the invention.

FIG. 3 contains a schematic perspective view of a heat exchanger, e.g., evaporator 534, in accordance with one embodiment of the present invention, and FIG. 4 contains a schematic cross-sectional diagram of the interior of the evaporator 534 of FIG. 3 in accordance with the invention. The heat exchanger 534 of FIGS. 3 and 4 can be used as the evaporator 134 or 434 in the refrigeration systems shown in FIG. 1 or 2, respectively. The evaporator 534 includes a refrigerant inlet 502 through which the system refrigerant enters the evaporator 534. The refrigerant passes through an orifice 503 and is distributed over vertically oriented heat exchange elements in the form of parallel plates 508. The refrigerant flows down in the spaces between the plates 508 to cool them and is collected at the bottom of the evaporator 534. It flows out of the evaporator 534 through the refrigerant outlet 510 and is cycled through the remainder of the refrigeration system.

In accordance with the invention, after the refrigerant passes through the orifice 503, it enters a distribution manifold 504 which is implemented in one embodiment as an insert in the inlet 502. The distribution manifold 504 is attached such as by threads, soldering, brazing or other method to the inside of the evaporator unit 534 at the refrigerant inlet 502. In one embodiment the distribution manifold is formed integrally with the orifice 503, that is, the distribution manifold 504 and orifice 503 are formed as a single unit with the orifice 503 serving as the input to the manifold 504. In one embodiment, the distribution manifold 504 and orifice 503 are formed from a single piece of metal, such as brass, by molding and/or machining.

Distribution manifold 504 includes a substantially flat, tilted deflection surface 506. Refrigerant under high pressure enters the manifold 504 from the orifice 503 and strikes the tilted deflection surface 506. The refrigerant impinges on the deflection surface 506 and flows or drips down into the spaces between the plates 508. Because of the tilt in the deflection surface, the refrigerant is evenly distributed across the plates 508 such that even and efficient cooling of the plates 508 is realized.

In many refrigeration systems which use evaporators and compressors, a lubricant is circulated through the refrigeration cycle along with the refrigerant in order to lubricate one or more components of the cycle, in particular the compressor. The refrigerant can separate from the lubricant. In conventional evaporators, the separated lubricant must be pumped out of the device and back into the refrigeration cycle. To effect this removal of lubricant, the conventional evaporator must be provided with a capillary tube in a reservoir area in which the lubricant collects. As shown in FIGS. 3 and 4, in one embodiment, the evaporator of the invention 534 is oriented such that the refrigerant and lubricant flow by gravity through the evaporator 534 over the plates 508 and out of the evaporator 534 at the bottom, without the need for a separate process and mechanism for removal of the lubricant. This adds considerable cost and efficiency savings to the evaporator of the invention.

As described above, the evaporator 534 of the invention is applicable in temperature control settings in which a circulating fluid is used to control temperature of a device such as a workpiece held on a workpiece chuck. To that end, the temperature control fluid can be circulated through the evaporator 534 to cool the fluid. The fluid enters the evaporator 534 through a fluid inlet 512 and flows through the evaporator 534 in channels 701 formed within the plates 508 and in tubes 703 connected between the plates 508. Heat is transferred from the temperature control fluid inside the plates to the refrigerant impinging on the outside surfaces of the plates to cool the fluid and heat the refrigerant. The cooled fluid exits the evaporator through the fluid outlet 514.

Thus, cold refrigerant enters the top of the evaporator 534 through the refrigerant inlet 502 and flows down along the plates 508 as it is warmed. The warmed refrigerant exits the evaporator 534 through the outlet 510 at the bottom. In contrast, the temperature control fluid in a relatively warm state enters the evaporator 534 at the bottom through the inlet 512 and flows up to the outlet 514. This arrangement provides for a highly efficient heat transfer since the circulating temperature control fluid travels toward the coldest refrigerant as it passes through the evaporator 534.

Figure 5A:
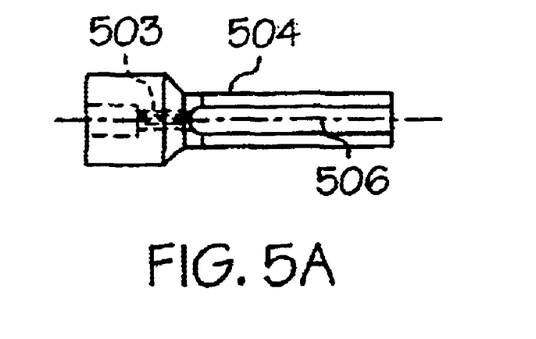
FIGS. 5A and 5B contain schematic cross-sectional views of one embodiment of the distribution manifold in accordance with the invention.
Figure 5B:
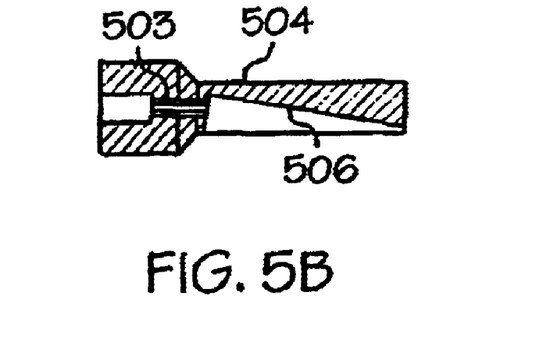

FIGS. 5A and 5B contain schematic cross-sectional views of the distribution manifold 504 in accordance with one embodiment of the invention. The drawings in FIGS. 5A and 5B are rotated with respect to each other ninety degrees about the longitudinal axis of the manifold 504. As shown in the figures, the manifold 504 in this embodiment includes the orifice 503 through which the refrigerant enters the evaporator 534. The manifold 504 also includes the tilted deflection surface 506 formed along the body of the manifold 504. As described above, the refrigerant enters the manifold 504 through the orifice 503 and is directed by the tilted deflection surface 506 such that the refrigerant is evenly distributed over the evaporator plates 508.

In another aspect, the invention provides the capability to purge the chuck and fluid circulating lines of any residual excess temperature control fluid which may remain in the lines and/or chuck during a temperature control cycle in which no fluid is being circulated. The purge can be performed during such a cycle. This purge process is done by forcing a gas such as air through the fluid circulating lines to remove excess fluid from the lines and the chuck and return the excess fluid to the fluid reservoir.

In one embodiment of the invention, the temperature-controlled fluid circulated through the chuck is a hydrofluoroether (HFE), such as methoxy-nonafluorobutane (C4F9OCH3), also known as 3M™ Novec™ Engineered Fluid HFE-7100. This type of fluid has a relatively low boiling point and breaks down at high temperatures such that fluoride ions can be formed and migrate into the chuck through the fluid circulation lines. In accordance with the invention, when the temperature control process enters a state in which no fluid is circulated through the lines and chuck, a purge can be run to blow air through the lines and chuck to remove any residual HFE fluid from the lines and chuck, thus preventing the formation and migration of fluoride ions into the chuck and wafer area.

Figure 6:
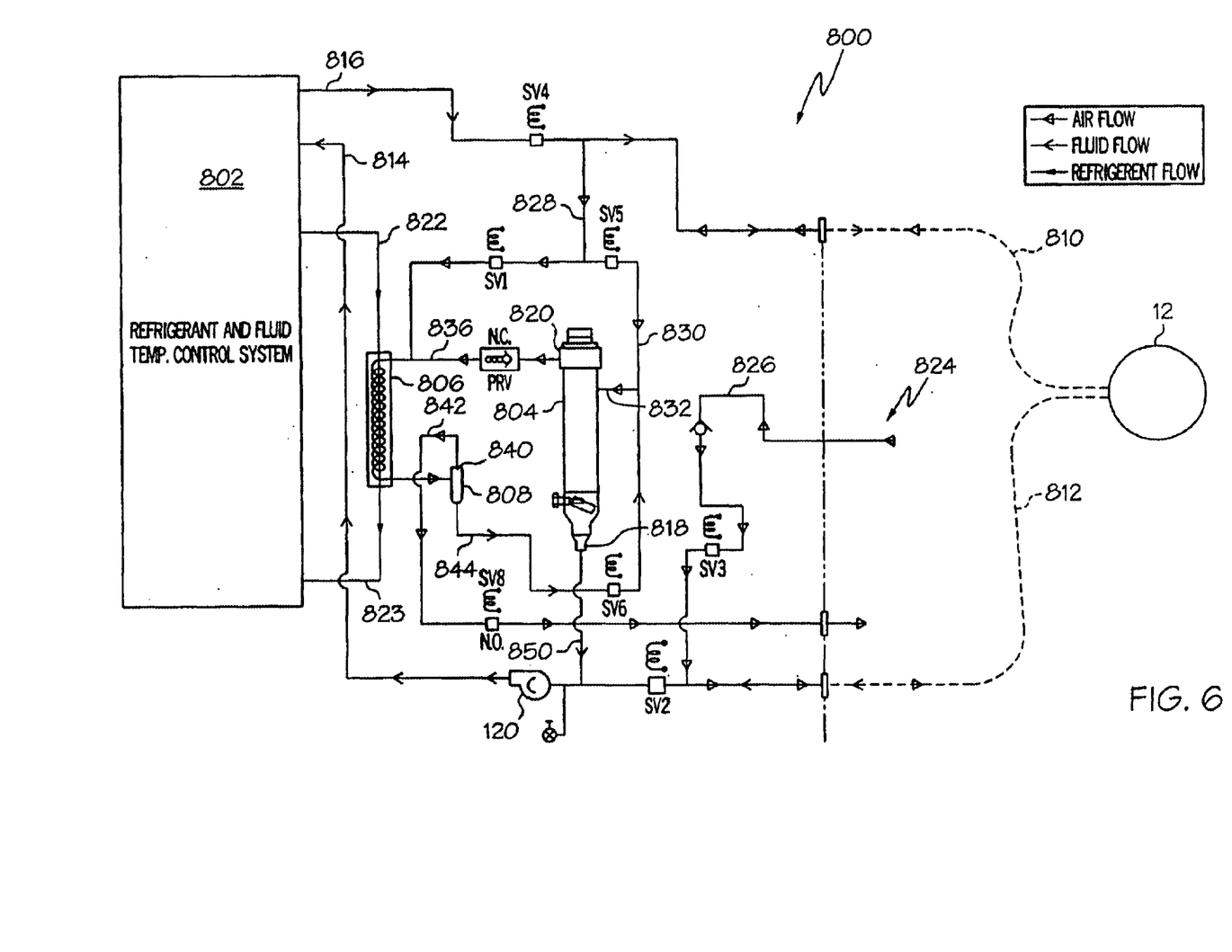
FIG. 6 is a schematic functional block diagram of a chuck temperature control system in which circulating temperature control fluid is purged from the chuck and circulation lines and is returned to the fluid circulation system.

FIG. 6 is a schematic functional diagram of another embodiment of the temperature control system of the invention. In the embodiment illustrated in FIG. 6, the HFE fluid circulated through the chuck 12 to control the temperature of the chuck is purged from the fluid circulation lines in accordance with the invention. As shown, the system 800 includes the refrigeration and fluid temperature control system 802 which generally refers to the temperature control systems in accordance with the invention described above. As shown in FIG. 6, the temperature control fluid is pumped by a pump 120 through fluid control line 814 into the temperature control system 802 where its temperature is controlled in accordance with the foregoing description. The fluid is routed out of the system 802 along fluid lines 816, then through line 810 to the chuck 12. The fluid is circulated through the chuck 12 and returns along line 812 to the pump 120 where it is recirculated.

As noted above, when the pump is turned off, the fluid is not circulated, and fluid can remain in the lines and chuck. If the chuck and lines are at high temperature, this residual fluid can continue to evaporate and break down, causing undesirable fluoride ions to migrate within the chuck and possibly in the workpiece area, potentially causing contamination. In accordance with this aspect of the invention, in order to remove or purge residual or excess HFE fluid from the lines 810, 812 and the chuck 12, air can be circulated through the lines and chuck. The air is provided at an inlet 824 and is circulated through line 826 which is coupled to the line 812 to the chuck 12. As it is circulated, the air mixes with residual HFE fluid and vapor. The air combined with HFE fluid and/or vapor from the chuck 12 and lines returns on line 810, through lines 828, 830 and 832 where it is provided as an input to the fluid reservoir 804. Hence, the system 800 of the invention allows excess residual HFE fluid to be removed from the circulating lines and chuck and returned to the fluid reservoir 804 where it can continue to be used to control temperature in the chuck.

As the air and fluid are input to the reservoir 804 at line 832, the air at the top of the reservoir above the HFE fluid, which is saturated with HFE vapors, is forced out of the top of the reservoir due to displacement. If this saturated air were simply vented to the atmosphere, substantial loss of HFE fluid would result. Instead, in accordance with the invention, the fluid in the air is recovered and returned to the reservoir 804 where it can be circulated to control the temperature of the chuck 12. In accordance with the invention, the air saturated with HFE vapor above the HFE fluid in the reservoir 804 is forced from the top of the reservoir 804 through a pressure relief valve PRV, through line 836 into a suction line heat exchanger 806. The heat exchanger 806 serves as a condenser which condenses the HFE fluid. Refrigerant for the suction line heat exchanger 806 can be provided from the refrigeration and fluid temperature control system 802 via refrigerant line 822. The refrigerant can be returned to the system 802 via refrigerant line 823. The heat exchanger 806 can be of the type sold by Packless Industries of Waco, Tex. Specifically, the suction heat exchanger 806 can be a Packless Industries model HXR-50 refrigerant heat exchanger.

The mixture of air and condensed HFE fluid exits the heat exchanger 806 on line 838 and enters a modified accumulator or fluid separator 808 where the air and fluid are separated. The air/fluid mixture enters on a tangent of the inside wall of the separator at a velocity and pressure sufficient to induce separation. The centrifugal forces within the accumulator 808 separate the air and the HFE fluid so that the air exhaust exits through the top 840 of the accumulator 808 and the condensed HFE fluid settles at the bottom of the accumulator 808. The air exhaust port 841 of the accumulator 808 can be blocked to pressurize the accumulator to a relatively high pressure, e.g., approximately 60 psi. With the reservoir 804 at approximately 2 psi and the accumulator 808 at approximately 60 psi, the solenoid valve SV6 is opened to force the condensed HFE fluid back to the reservoir 804 via line 832, thereby recovering a large amount of the fluid and minimizing losses and vapor escaping into the atmosphere. When the air exhaust port 841 at the top of the accumulator 808 is opened, the separated air is carried along line 842 through solenoid valve SV8 and is vented to the atmosphere.

HFE fluid collected in the reservoir 804 passes out of the bottom 818 of the reservoir 804 and is routed back to the pump 120 along line 850 when additional fluid is required. Thus, fluid which might have been lost is recovered and continues to be used to control the temperature of the chuck 12.

The fluid recovery or purge sequence will now be described with reference to FIG. 6. During a cold purge, the pump 120 is turned off, solenoid valve SV2 closes and solenoid valve SV3 opens, allowing 60 psig air into the fluid lines 812, 810 and the chuck 12, thus forcing the fluid back toward the reservoir 804. Valves SV6, SV4 and SV1 are closed and SV5 is opened, allowing the purged fluid to flow to the reservoir 804 along lines 810, 828, 830 and 832. When the returning fluid and purge air enter the reservoir 804, as described above, they displace the saturated vapors of the HFE fluid contained in the reservoir 804. The displaced vapors along with the purge air exit the reservoir 804 to the suction line heat exchanger 806 where the vapors are condensed into HFE liquid. The condensed fluid and the purge air continue on to the fluid separator (modified accumulator) 808 where they separated. The air is exhausted to the atmosphere through normally opened solenoid valve SV8 while the fluid remains at the bottom of the separator 808.

When the purge is over, valve SV3 closes, shutting off air to the system. In one embodiment, approximately ten seconds later, valve SV5 and SV8 close, isolating the reservoir 804 from the suction line heat exchanger 806 and the separator 808. In one embodiment, after a delay of approximately two seconds, valves SV3 and SV1 open, allowing air to pressurize the suction line heat exchanger 806 and the fluid separator 808 to approximately 60 psig. At this time, the reservoir 804 is at approximately 2 psig set by the relief valve PRV. In one embodiment, after about ten seconds, valves SV3 and SV1 close and, approximately two seconds later, valve SV6 opens, forcing the fluid back to the reservoir 804. Approximately ten seconds later, valves SV8 and SV1 open while SV6 closes, allowing the system to vent. Then, after a delay of about one second, SV1 closes.

Figure 7A:
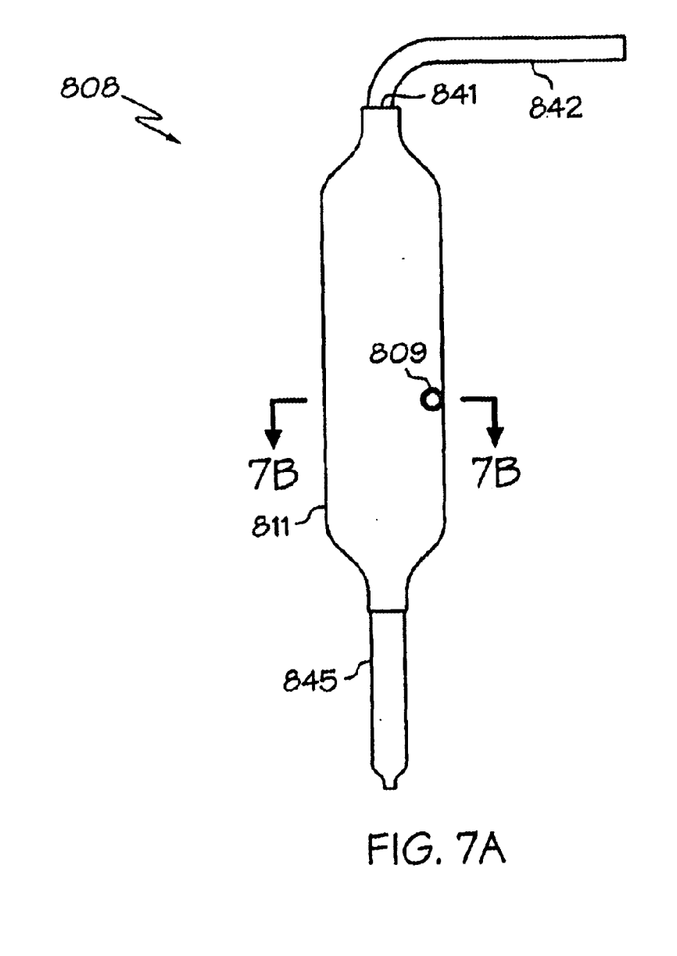
FIG. 7A is a diagram of the fluid separator (modified accumulator), in accordance with one embodiment of the invention.
Figure 7B:
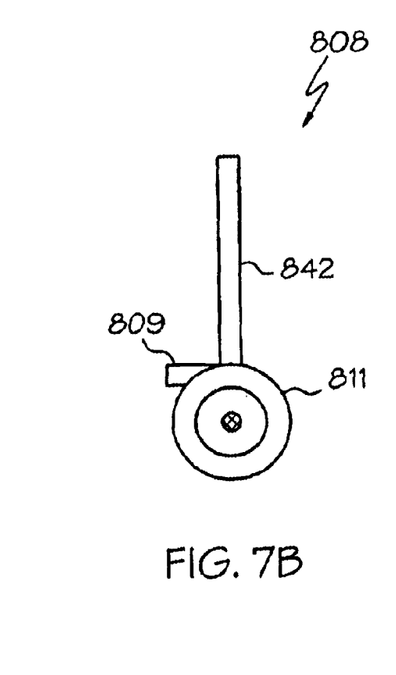
FIG. 7B is a cross-sectional view of the separator of the invention, taken along line A—A of FIG. 7A.

FIG. 7A is a diagram of the fluid separator (modified accumulator) 808, in accordance with one embodiment of the invention. FIG. 7B is a cross-sectional view of the separator 808, taken along line A–A of FIG. 7A. The separator 808 includes a resonator/muffler body section 811 within which the air and fluid circulate. The air/fluid combination enters the resonator/muffler body section 811 through an inlet 809, which is oriented tangentially with respect to the interior wall of the resonator/muffler body section 811. The air/fluid enter at sufficiently high velocity and pressure that as they spin through the interior, the centrifugal forces separate them. The separated fluid escapes through an optional strainer outlet 845, which is connected to fluid line 844 (see FIG. 6), and the separated air escapes at the opposite end through the air line 842 attached to the separator 808.

While this invention has been particularly shown and described with references to preferred embodiments thereof, it will be understood by those skilled in the art that various changes in form and details may be made therein without departing from the spirit and scope of the invention as defined in the following claims.

What is claimed is:

1. A temperature control system for a workpiece chuck comprising:
   a fluid circulation system for circulating a temperature control fluid through the workpiece chuck; and
   a fluid recovery system coupled to the fluid circulation system for recovering the temperature control fluid from the fluid circulation system, the fluid recovery system comprising:
      a gas inlet for allowing gas to be forced into the fluid circulation system and circulated through the fluid circulation system to carry a first portion of recovered temperature control fluid through the fluid circulation system,
      a reservoir receiving the gas circulated through the fluid circulation system and the first portion of recovered temperature control fluid, the reservoir comprising an outlet above the temperature control fluid in the reservoir, the gas and the first portion of recovered temperature control fluid received by the reservoir displacing a portion of the gas with vapor of the temperature control fluid out of the reservoir through the outlet above the temperature control fluid in the reservoir,
      a heat exchanger for receiving the displaced gas with vapor and condensing the vapor to produce a second portion of recovered temperature control fluid,
      a separator for receiving the displaced gas and the condensed second portion of the recovered temperature control fluid and separating the displaced gas from the condensed second portion of the recovered temperature control fluid, and
      a fluid line for carrying the condensed second portion of the recovered temperature control fluid from the separator to the reservoir.

2. The temperature control system of claim 1, wherein the temperature control fluid comprises a hydrofluoroether (HFE).

3. The temperature control system of claim 1, wherein the temperature control fluid comprises methoxynonafluorobutane (C4F9OCH3).

4. The temperature control system of claim 1, wherein the gas forced through the fluid circulation system is air.

5. The temperature control system of claim 1, wherein the fluid recovery system further comprises a gas line for venting separated gas from the separator to the atmosphere.

6. A method for controlling temperature in a workpiece chuck comprising:
   providing a circulation system for circulating a temperature control fluid through the workpiece chuck; and
   coupling a fluid recovery system to the fluid circulation system for recovering the temperature control fluid from the fluid circulation system;
   circulating a gas through the fluid circulation system to carry a first portion of recovered temperature control fluid through the fluid circulation system;
   providing a reservoir for receiving the gas circulated through the fluid circulation system and the first portion of recovered temperature control fluid, the reservoir comprising an outlet above the temperature control fluid in the reservoir, the gas and the first portion of recovered temperature control fluid received by the reservoir displacing a portion of the gas with vapor of the temperature control fluid out of the reservoir through the outlet above the temperature control fluid in the reservoir,
   routing the displaced gas with vapor of the temperature control fluid to a heat exchanger, the heat exchanger condensing the vapor of the temperature control fluid to produce a condensed second portion of the recovered temperature control fluid,
   routing the displaced gas and the condensed second portion of the recovered temperature control fluid to a separator, the separator separating the displaced gas from the condensed second portion of the recovered temperature control fluid, and
   routing the condensed second portion of the recovered temperature control fluid from the separator to the reservoir.

7. The method of claim 6, wherein the temperature control fluid comprises a hydrofluoroether (HFE).

8. The method of claim 6, wherein the temperature control fluid comprises methoxy-nonafluorobutane (C4F9OCH3).

9. The method of claim 6, wherein the gas forced through the fluid circulation system is air.

10. The method of claim 6, further comprising venting separated gas from the separator to the atmosphere.

* * * * *